United States Patent [19]
Anantha et al.

[11] Patent Number: 4,796,069
[45] Date of Patent: Jan. 3, 1989

[54] SCHOTTKY DIODE HAVING LIMITED AREA SELF-ALIGNED GUARD RING AND METHOD FOR MAKING SAME

[75] Inventors: Narasipur G. Anantha, Hopewell Junction; Harsaran S. Bhatia; Santosh P. Gaur, both of Wappingers Falls, all of N.Y.; John L. Mauer, IV, South Kent, Conn.

[73] Assignee: International Business Machines Corporation, Armonk, N.Y.

[21] Appl. No.: 63,345

[22] Filed: Jun. 18, 1987

Related U.S. Application Data

[62] Division of Ser. No. 263,227, May 13, 1981, Pat. No. 4,691,435.

[51] Int. Cl.$^4$ ............... H01L 29/48; H01L 29/34; H01L 29/04
[52] U.S. Cl. ............................. 357/15; 357/52; 357/54; 357/59
[58] Field of Search ............... 357/15, 59, 54, 52, 357/23

[56] References Cited

U.S. PATENT DOCUMENTS

| T101,201 | 11/1981 | Anantha et al. | 357/15 |
| 3,907,617 | 9/1975 | Zwernemann | 357/15 |
| 4,209,349 | 6/1980 | Ho et al. | 357/49 |

FOREIGN PATENT DOCUMENTS

| 54-161887 | 12/1979 | Japan | 357/15 |

OTHER PUBLICATIONS

S. U. Kim, "A Very Small Schottky Barrier Diode (SBD) with Self-Aligned Guard Ring for VLSI Applications", IEDM 1978, Proceeding IEEE, (Dec. 1979), pp. 49–53.

F. H. Gaensslen, "Nitride-Limited Schottky Barrier Diode Design", *IBM Technical Disclosure Bulletin*, vol. 22, (1980), pp. 3397–3398.

S. U. Kim, "Plasma-Deposited Refractory Metal-Nitride Schottky Barrier Diodes", *IBM Technical Disclosure Bulletin*, vol. 21, (1978), pp. 936–937.

C. G. Jambotkar et al, "Schottky Barrier Diode with Isolated Guard Ring", *IBM Technical Disclosure Bulletin*, vol. 20, (1978), pp. 3197–3198.

*Primary Examiner*—J. Carroll
*Attorney, Agent, or Firm*—T. Rao Coca; Otho B. Ross, III

[57] ABSTRACT

A method is disclosed for fabricating a small area, self aligned guard ring in a Schottky barrier diode. A vertically-walled hole is anisotropically etched completely through a dielectric layer on a silicon substrate. A layer of doped polycrystalline silicon is deposited over the apertured dielectric layer. The polycrystalline silicon is reactively ion etched away to leave only a lining about the perimeter of the hole in the dielectric layer. The structure is heated to diffuse the dopant from the lining into the substrate. Schottky diode metal is deposited on the substrate exposed through the lined aperture in the dielectric layer.

2 Claims, 2 Drawing Sheets

SCHOTTKY DIODE HAVING LIMITED AREA SELF-ALIGNED GUARD RING AND METHOD FOR MAKING SAME

This is a division of application Ser. No. 263,227, filed on May 13, 1981, that matured to U.S. Pat. No. 4,691,435.

BACKGROUND OF THE INVENTION

1. Field of the Invention

The invention generally relates to self-aligned guard ring Schottky diodes and, more particularly, to such diodes wherein the area of the guard ring is reduced to a very accurately controlled minimum.

2. Description of the Prior Art

A self-aligned Schottky barrier diode guard ring which uses a minimum of the device area has been desired for many years. Various techniques have been proposed but leave unsolved the problem of very accurately controlling the minimized surface area of the guard ring in order that reproducible diode characteristics can be achieved. One technique is shown in U.S. Pat. No. 4,063,964 for "Method for Forming a Self-Aligned Schottky Barrier Device Guardring", issued Dec. 20, 1977 in the names of Peressini et al. and assigned to the assignee of the present invention. Said patent relies on the heat induced shrinkage of a metal silicide Schottky barrier-forming metal to delineate the area of a subsequently diffused guard ring. In the paper "A Very Small Schottky Barrier Diode (SBD) With Self-Aligned Guard Ring for VLSI Applications" by Sang U. Kim published in the December, 1979 IEEE Proceedings, p. 49, the area of the guard ring depends upon the extent of lateral undercut of nitride-oxide layers which, in turn, depends upon the etching time of the underlying oxide layer. Neither technique provides optimum area control whereby the smallest area self-aligned guard rings are achieved in a reproducible manner. The IBM® Technical Disclosure Bulletin, Vol. 21, No. 7, December 1978, pg. 2752 describes a technique for using a boron-doped polysilicon ring for diffusing the guard ring area of a Schottky diode but the polysilicon ring is determined photolithographically and is not of minimum area. Defensive Publication No. T101201, issued Nov. 3, 1981 by Anantha et al. discloses a Schottky diode having no guard ring but which employs an undoped polycrystalline silicon ring which is formed about an isotropically etched hole in nitride-oxide layers, the oxide layer being undercut relative to the nitride layer. The purpose of the ring is to eliminate the "mousehole" (or undercut region) in the oxide prior to placing a Schottky contact inside the ring and on the underlying silicon substrate. The thickness of the polycrystalline ring must be sufficient to fill in the undercut region of the oxide, the dimensions of which can not be closely controlled. If the ring, contrary to the teaching of said copending patent application, had been doped so as to form a guard ring, the area of the guard ring would likewise not be closely controllable.

SUMMARY OF THE INVENTION

A guard ring Schottky diode and a method for fabricating same in which a self-aligned guard ring of minimum area is centered about a Schottky contact made to a silicon substrate. A substantially vertically walled hole is anisotropically etched completely through a layer of dielectric material on a silicon substrate. Doped polycrystalline silicon is deposited over the apertured dielectric material and into the hole, the thickness of said polycrystalline silicon being controlled in accordance with the area desired for the guard ring. The deposited polycrystalline is anisotropically etched to remove it from all nonvertical surfaces of the structure and to expose the substrate through the apertured dielectric layer. The remaining structure is heated so as to diffuse the dopant from the deposited polycrystalline silicon into the substrate to form the guard ring. Schottky diode metal is deposited on the substrate exposed through the apertured dielectric layer.

DESCRIPTION OF THE PREFERRED EMBODIMENT

In a guard ring Schottky Diode, forward current increases as the area of the guard ring increases. That is, the p-n junction of the ring conducts at a lower forward voltage as the ring area increases. Additionally, charge storage effects in the p-n junction of the ring increase with ring area, and slow down the maximum attainable switching speed. Only the direct current reverse diode characteristic is not adversely affected by ring size. Thus, smaller ring size is desirable in view of the foregoing considerations as well as the fact that greater circuit density is facilitated thereby for large scale integration purposes.

Provision is made, according to the present invention, for achieving minimum guard ring size, below presently attainable diffusion mask opening sizes, by the utilization of anisotropic etching and doped polycrystalline silicon deposition techniques.

Figure 1:
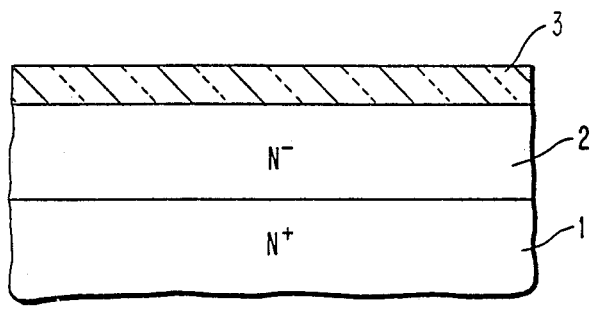
FIGS. 1-4 are a series of cross-sectional views of a preferred embodiment of the invention showing the structure resulting at successive times during the course of fabrication.

Starting with N+ substrate 1 of FIG. 1 of about 0.001 $\Omega$cm silicon material, N— epitaxial layer 2, of about 0.3 $\Omega$cm silicon material, is deposited to a thickness of about 1 micrometer. Epitaxial layer 2 is covered with a dielectric material such as thermally grown silicon dioxide layer 3 to a thickness preferably in the range of about 2000 Å to about 5000 Å. The SiO$_2$ layer 3, in turn, is covered by a photoresist (not shown), for example, approximately 1 micrometer thickness of HC resist. The photoresist is exposed and developed in those areas where Schottky diode contacts are desired to be located.

Using the patterned photoresist as a mask, the SiO$_2$ layer 3 is anisotropically etched, as by reactive ion etching, to produce substantially vertically-walled holes in SiO$_2$ layer 3 where Schottky diode contacts are desired. Then, as shown in FIG. 2, p+ doped polycrystalline silicon layer 4 is deposited to a thickness preferably in the range from about 2500 Å to about 3000 Å.

The thickness of polysilicon layer 4 is closely controlled as it will determine the area of a selfaligned guard ring to be formed in epi layer 2 after further processing. The processing includes the reactive ion etching and dopant drive-in techniques disclosed in U.S. Pat. No. 4,209,350, issued June 24, 1980 to Ho et al. for Method For Forming Diffusions Having Narrow Dimensions Utilizing Reactive Ion Etching and assigned to the present assignee.

Figure 2:
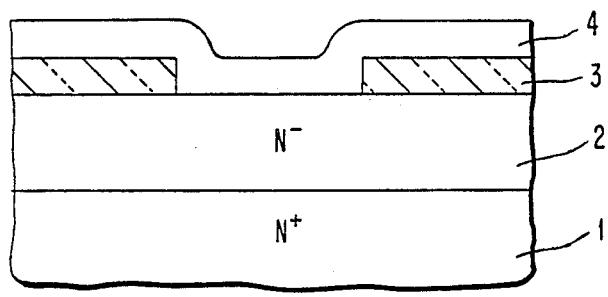
Figure 3:
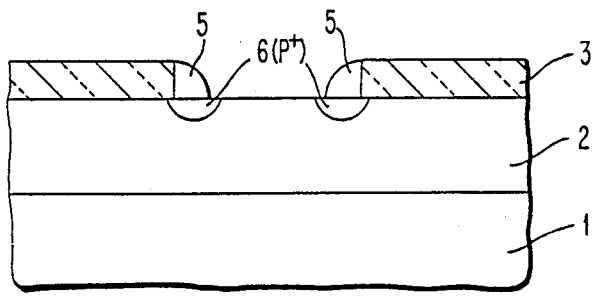

The reactive ion etching of doped polysilicon layer 4 removes said layer from all horizontal surfaces of the structure of FIG. 2, leaving doped polycrystalline silicon only along the substantially vertical surfaces of the edges of the hole in SiO$_2$ layer 3 as shown in FIG. 3. The resulting structure is annealed at a suitable temperature and time, such as at about 1000° C. for about 1 hour, to cause the dopant in polysilicon sidewall 5 to diffuse into epi layer 2 to form guard ring 6. The Schottky diode is completed by deposition of suitable metal 7 of FIG. 4 such as the group comprising PtSi, Pt, Pd, Al and Mo (for high barrier diodes). If a low barrier diode is required, a metal such as Ti, Ta, Hf, Cr or Ti-W may be used as the Schottky contact metal.

Figure 5:
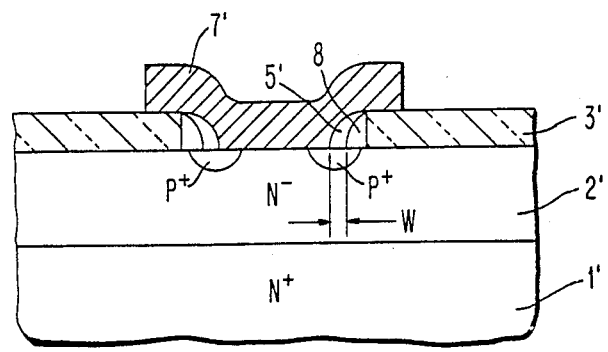
FIG. 5 is a cross-sectional view of an alternative embodiment.

Provision is made in another species of the present invention shown in FIG. 5 for reducing the size of the resultant guard ring Schottky diode so as to occupy only a portion of the hole originally etched through SiO$_2$ layer 31. In this manner, the resolution limitations of the photolithography, which masked SiO$_2$ layer 3 against etching, can be avoided where a minimum sized Schottky diode and guard ring are required. The fabrication process initially is the same as described in connection with FIG. 1. After SiO$_2$ layer 3 is apertured, however, another layer of SiO$_2$ is chemically vapor deposited and is reactively ion etched to leave only sidewall portion 8 which partially fills in the hole originally etched in SiO$_2$ layer 3. The structure then is completed as described before, i.e., a layer of doped polycrystalline silicon is deposited and reactively ion etched to leave only sidewall portion 5', the dopant is driven into the epi 21 by annealing and an appropriate Schottky contact metal 7' is deposited.

Figure 4:
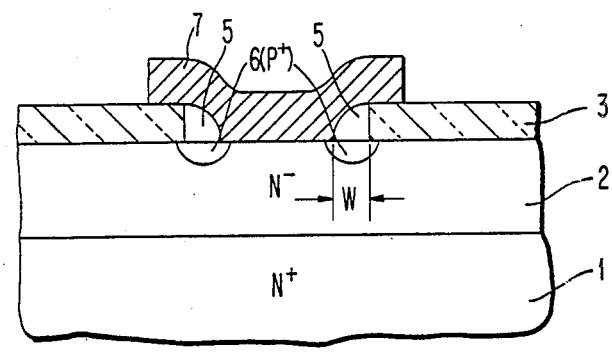

It has been found that the minimum horizontal width thickness W of the doped sidewall portion 5 and 5' of FIGS. 4 and 5, respectively, should be of the order of about 1000 Å so the resultant guard ring is of sufficient area to reduce the electric field at the corners of the Schottky diode contact to acceptable levels. The maximum width of the total sidewall portions is limited by the thickness of the SiO$_2$ layer 3. Therefore, the thickness of the SiO$_2$ layer 3 in the single sidewall case of FIG. 4 generally should be greater than 1000 Å but need not be greater than about 3000 Å while the SiO$_2$ layer 3 thickness in the double sidewall case of FIG. 5 generally need not be greater than about 5000 Å. The dopant concentration in the doped sidewall portion should be at least one order of magnitude greater than the dopant concentration in the underlying epi layer.

We claim:

1. A self-aligned guard ring Schottky barrier diode comprising
    a dielectric layer of a first thickness on a silicon substrate, said layer having a substantially vertically walled hole therein,
    a doped silicon lining about the perimeter of said hole, said lining being of uniform horizontal width thickness in the range from about 1000 Å to about 3000 Å and being spaced from the perimeter of said hole by a lining of dielectric material, and
    Schottky barrier contact metal on said substrate exposed within said lining.

2. The diode defined in claim 1 wherein said thickness of said dielectric layer is not greater than about 5000 Å.

* * * * *

UNITED STATES PATENT AND TRADEMARK OFFICE
CERTIFICATE OF CORRECTION

PATENT NO.  : 4,796,069
DATED       : January 3, 1989
INVENTOR(S) : NARASIPUR G. ANANTHA ET AL.

It is certified that error appears in the above-identified patent and that said Letters Patent is hereby corrected as shown below:

```
In column 3, line 21:  change "31" to --3'--;
In column 3, line 26:  change "3"  to --3'--;
In column 3, line 31:  change "3"  to --3'--;
In column 4, line  1:  change "21" to --2'--.
```

Signed and Sealed this

Thirteenth Day of February, 1990

*Attest:*

JEFFREY M. SAMUELS

*Attesting Officer*   Acting Commissioner of Patents and Trademarks